US011355649B2

(12) United States Patent
Lee et al.

(10) Patent No.: US 11,355,649 B2
(45) Date of Patent: Jun. 7, 2022

(54) NANOSHEET TRANSISTOR HAVING ABRUPT JUNCTIONS BETWEEN THE CHANNEL NANOSHEETS AND THE SOURCE/DRAIN EXTENSION REGIONS

(71) Applicant: International Business Machines Corporation, Armonk, NY (US)

(72) Inventors: Choonghyun Lee, Rensselaer, NY (US); Kangguo Cheng, Schenectady, NY (US); Juntao Li, Cohoes, NY (US); Shogo Mochizuki, Clifton Park, NY (US)

(73) Assignee: INTERNATIONAI BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/136,160

(22) Filed: Dec. 29, 2020

(65) Prior Publication Data

US 2021/0151608 A1    May 20, 2021

Related U.S. Application Data

(62) Division of application No. 16/406,390, filed on May 8, 2019, now Pat. No. 10,892,368.

(51) Int. Cl.
*H01L 29/786* (2006.01)
*H01L 29/775* (2006.01)
(Continued)

(52) U.S. Cl.
CPC .... *H01L 29/78696* (2013.01); *H01L 29/0665* (2013.01); *H01L 29/161* (2013.01);
(Continued)

(58) Field of Classification Search
None
See application file for complete search history.

(56) References Cited

U.S. PATENT DOCUMENTS 7,601,570 B2   10/2009 Damlencourt
8,574,981 B2   11/2013 Flachowsky et al.
(Continued)

OTHER PUBLICATIONS

List of IBM Patents or Patent Applications Treated as Related; Date Filed: Jan. 11, 2021, 2 pages.

*Primary Examiner* — Alexander G Ghyka
(74) *Attorney, Agent, or Firm* — Cantor Colburn LLP; Samuel Waldraum

(57) ABSTRACT

Embodiments of the invention are directed to a nanosheet field effect transistor (FET) having a nanosheet stack formed over a substrate. The nanosheet stack includes a plurality of channel nanosheets, wherein the plurality of channel nanosheets includes a first channel nanosheet having a first end region, a second end region, and a central region positioned between the first end region and the second end region. The first end region and the second end region include a first type of semiconductor material, wherein, when the first type of semiconductor material is at a first temperature, the first type of semiconductor material has a first diffusion coefficient for a dopant. The central region includes a second type of semiconductor material, wherein, when the second type of semiconductor material is at the first temperature, the second type of semiconductor material has a second diffusion coefficient for the dopant.

20 Claims, 13 Drawing Sheets

(51) Int. Cl.
*H01L 29/161* (2006.01)
*H01L 29/06* (2006.01)
*H01L 29/66* (2006.01)
*H01L 29/423* (2006.01)

(52) U.S. Cl.
CPC .. *H01L 29/42392* (2013.01); *H01L 29/66439* (2013.01); *H01L 29/775* (2013.01)

(56) References Cited

U.S. PATENT DOCUMENTS

| | | |
|---|---|---|
| 9,620,590 B1 | 4/2017 | Bergendahl et al. |
| 9,812,449 B2 | 11/2017 | Obradovic et al. |
| 2017/0005190 A1 | 1/2017 | Chang et al. |
| 2017/0133513 A1 | 5/2017 | Hong et al. |
| 2017/0221992 A1 | 8/2017 | Chang et al. |
| 2018/0108769 A1 | 4/2018 | Cheng et al. |
| 2018/0108778 A1 | 4/2018 | Chan et al. |
| 2018/0175194 A1 | 6/2018 | Roboh et al. |
| 2018/0308988 A1 | 10/2018 | Chao et al. |
| 2018/0047853 A1 | 12/2018 | Chang et al. |
| 2019/0189769 A1* | 6/2019 | Basker .............. H01L 29/66553 |
| 2019/0341467 A1 | 11/2019 | Basker et al. |
| 2019/0348523 A1 | 11/2019 | Hiblot et al. |
| 2020/0075716 A1 | 3/2020 | Wang et al. |
| 2020/0105929 A1 | 4/2020 | Zhang et al. |
| 2020/0168507 A1 | 5/2020 | Chang et al. |
| 2020/0235206 A1 | 7/2020 | Xu et al. |
| 2020/0357931 A1 | 11/2020 | Lee et al. |
| 2021/0234020 A1* | 7/2021 | Mochizuki ............ H01L 29/775 |
| 2021/0359103 A1* | 11/2021 | Xie .................. H01L 29/66553 |

* cited by examiner

NANOSHEET TRANSISTOR HAVING ABRUPT JUNCTIONS BETWEEN THE CHANNEL NANOSHEETS AND THE SOURCE/DRAIN EXTENSION REGIONS

DOMESTIC PRIORITY

This application is a divisional of U.S. patent application Ser. No. 16/406,390, filed May 8, 2019, the disclosure of which is incorporated by reference herein in its entirety.

BACKGROUND

The present invention relates in general to fabrication methods and resulting structures for semiconductor devices. More specifically, the present invention relates to fabrication methods and resulting structures for nanosheet transistors having abrupt junctions formed between the channel nanosheets and the source or drain (S/D) extension regions.

In contemporary semiconductor device fabrication processes, a large number of semiconductor devices, such as n-type field effect transistors (nFETs) and p-type field effect transistors (pFETs), are fabricated on a single wafer. Non-planar transistor device architectures (e.g., fin-type FETs (FinFETs) and nanosheet FETs) can provide increased device density and increased performance over planar transistors. For example, nanosheet transistors, in contrast to conventional planar FETs, include a gate stack that wraps around the full perimeter of multiple stacked nanosheet channel regions for a reduced device footprint and improved control of channel current flow. Nanosheet transistors also enable full depletion in the nanosheet channel regions and reduce short-channel effects.

SUMMARY

Embodiments of the invention are directed to a method that includes forming a nanosheet stack over a substrate. The nanosheet stack includes a first channel nanosheet having a first end region, a second end region, and a central region positioned between the first end region and the second end region. Each of the first end region, the second end region, and the central region includes a first type of semiconductor material, wherein, when the first type of semiconductor material is at a first temperature, the first type of semiconductor material has a first diffusion coefficient for a dopant. The central region is converted to a second type of semiconductor material, wherein, when the second type of semiconductor material is at the first temperature, the second type of semiconductor material has a second diffusion coefficient for the dopant.

Embodiments of the invention are directed to a method that includes forming a nanosheet stack over a substrate. The nanosheet stack includes a plurality of channel nanosheets, wherein the plurality of channel nanosheets includes a first channel nanosheet having a first end region, a second end region, and a central region positioned between the first end region and the second end region. The first end region, the second end region, and the central region are each formed from a first type of semiconductor material, wherein, when the first type of semiconductor material is at a first temperature, the first type of semiconductor material has a first diffusion coefficient for a dopant. A source or drain (S/D) region is formed over the substrate, wherein forming the S/D region includes epitaxially growing the S/D region from the first end region such that the S/D region is communicatively coupled to the first end region. The S/D region is doped with the dopant. The central region is converted to a second type of semiconductor material, wherein, when the second type of semiconductor material is at the first temperature, the second type of semiconductor material has a second diffusion coefficient for the dopant. A junction is formed between the first end region and the central region by applying a first anneal at the first temperature to the S/D region and the first end region, wherein the first anneal is configured to diffuse the dopant from the S/D region through the first end region that includes the first type of semiconductor material having the first diffusion coefficient for the dopant. The first diffusion coefficient is greater than the second diffusion coefficient.

Embodiments of the invention are directed to a nanosheet field effect transistor (FET) having a nanosheet stack formed over a substrate. The nanosheet stack includes a plurality of channel nanosheets, wherein the plurality of channel nanosheets includes a first channel nanosheet having a first end region, a second end region, and a central region positioned between the first end region and the second end region. The first end region and the second end region include a first type of semiconductor material, wherein, when the first type of semiconductor material is at a first temperature, the first type of semiconductor material has a first diffusion coefficient for a dopant. The central region includes a second type of semiconductor material, wherein, when the second type of semiconductor material is at the first temperature, the second type of semiconductor material has a second diffusion coefficient for the dopant.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1-11 depict diagrams related to a nanosheet-based structure after various fabrication operations for forming abrupt junctions between the channel nanosheets and the extension regions in accordance with aspects of the invention, in which:

FIG. 1 depicts a cross-sectional view of a nanosheet-based structure after initial fabrication operations in accordance with aspects of the present invention;

FIG. 2 depicts a cross-sectional view of a nanosheet-based structure after additional fabrication operations in accordance with aspects of the present invention;

FIG. 3 depicts a cross-sectional view of a nanosheet-based structure after additional fabrication operations in accordance with aspects of the present invention;

FIG. 4 depicts a cross-sectional view of a nanosheet-based structure after additional fabrication operations in accordance with aspects of the present invention;

FIG. 5 depicts a cross-sectional view of a nanosheet-based structure after additional fabrication operations in accordance with aspects of the present invention;

FIG. 6 depicts a cross-sectional view of a nanosheet-based structure after additional fabrication operations in accordance with aspects of the present invention;

FIG. 7 depicts a cross-sectional view of a nanosheet-based structure after additional fabrication operations in accordance with aspects of the present invention;

FIG. 9 depicts a cross-sectional view of a nanosheet-based structure after additional fabrication operations in accordance with aspects of the present invention;

FIG. 11 depicts a cross-sectional view of a nanosheet-based structure after additional fabrication operations in accordance with aspects of the present invention.

DETAILED DESCRIPTION

Figure 1:
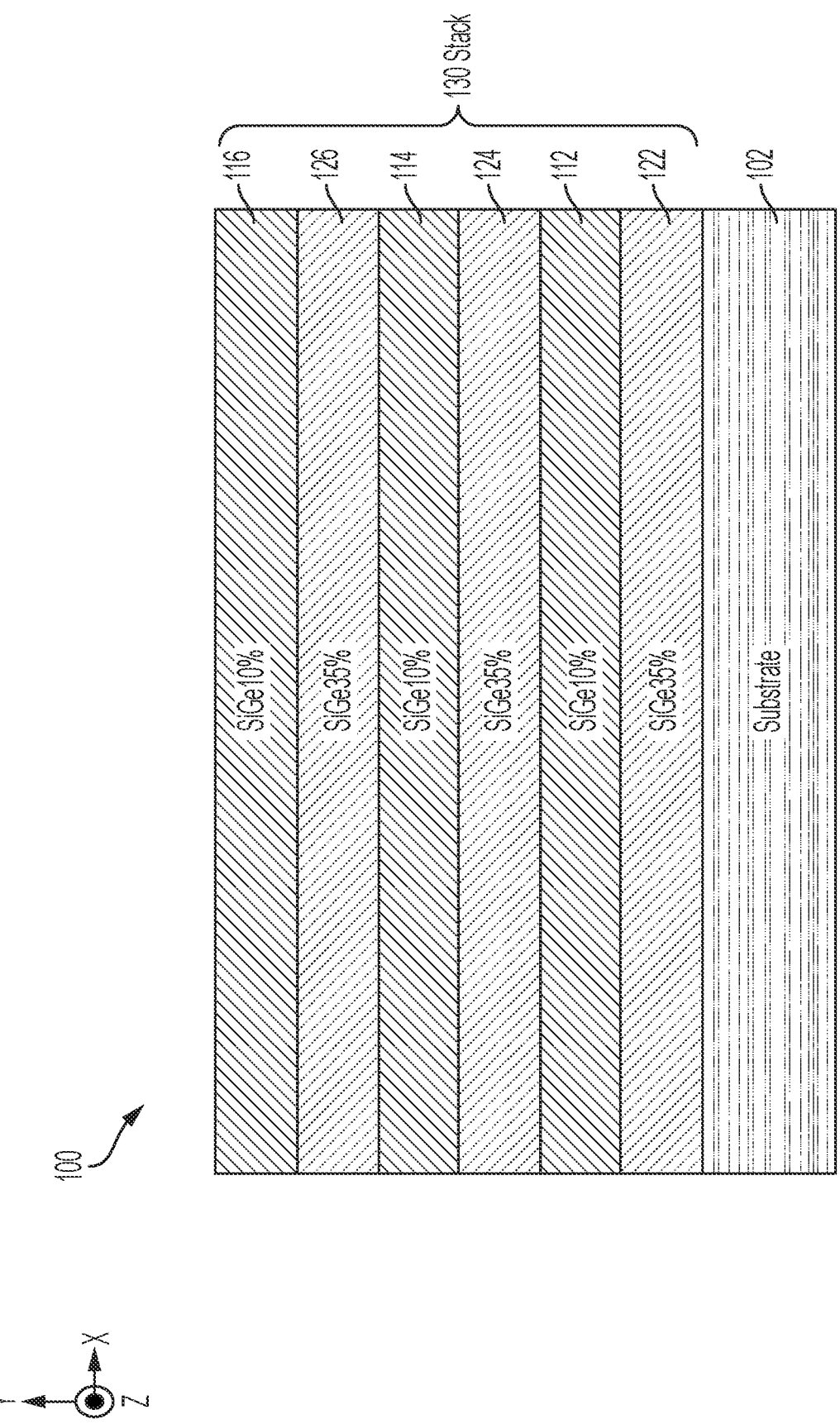

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an IC having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet FETs that provide the performance characteristics required for a particular application. For example, some key factors when designing p-type GAA nanosheet FETs are improving hole mobility, gate stack reliability, and negative bias temperature instability (NBTI). To address these issues, forming the channel nanosheets from SiGe having a high-Ge-content (e.g., Ge percentage>20%) is attracting attention because of the superior hole mobility and gate stack reliability of SiGe. However, in nanosheet FETs, the end regions of the high-Ge-content SiGe channel nanosheet that interface with the doped source or drain (S/D) regions will become the S/D extension regions after the dopant drive-in anneal has been performed. Because p-type dopants (e.g., Boron) diffuse slowly through a high-Ge-content SiGe material, the high-Ge-content nanosheet channel end regions create non-abrupt extension junctions that underlap the gate, which is undesirable. In general, an abrupt p/n junction is a sharp interface between a p-type semiconductor material and an n-type semiconductor material. In other words, an interface between the two semiconductors is an abrupt interface if the p/n properties of the two semiconductors change sharply across the junction.

Turning now to an overview of aspects of the invention, embodiments of the invention provide fabrication methods and resulting structures for nanosheet FETs having abrupt junctions formed at or near the interface between the channel nanosheets and the S/D extension regions. In embodiments of the invention, each channel nanosheet is formed from a first type of semiconductor material, wherein, when the first type of semiconductor material is at a first temperature, the first type of semiconductor material has a first diffusion coefficient (D1) for a dopant. A S/D region is doped with the dopant and communicatively coupled to ends of the channel nanosheet. A central region of the channel nanosheet is converted to a second type of semiconductor material, wherein, when the second type of semiconductor materials is at the first temperature, the second type of semiconductor material has a second diffusion coefficient (D2) for the dopant. After the central region of the channel nanosheet has been converted to the second type of semiconductor material, the channel nanosheet includes a first end region at D1, a second end region at D1, and a central region at D2. In aspects of the invention, the central region is positioned between the first end region and the second end region. In aspects of the invention, D1 is greater than D2. In other words, the dopant diffuses at the first temperature faster through the first and second end regions than the central region. A dopant drive-in anneal is applied at the first temperature, which causes the dopant to diffuse from the doped S/D region into the first and second end regions, thereby converting the first and second end regions to S/D extension regions. Each of the S/D extension regions forms a p/n junction with the central region of the channel nanosheet. In accordance with aspects of the invention, because D1 is greater than D2, the dopant moves quickly through the first and second end regions, and moves more slowly through the central region, thereby forming an abrupt p/n junction between the S/D extension regions (i.e., the first and second end regions) and the central region.

In aspects of the invention, the central region is converted to the second type of semiconductor material by depositing a donor layer on the central region and exposing the donor layer and the central region to a low temperature anneal (e.g., about 500 C-700 C) in an inert gas ambient (e.g., $N_2$) with no oxygen. The low-temperature anneal initiates a chemical reaction between the donor layer and the central region, and the chemical reaction converts the central region from the first type of semiconductor material to the second type of semiconductor material.

In accordance with aspects of the invention, the first type of semiconductor material can be low-Ge-content SiGe (e.g., Ge content less than or equal to about 20%) SiGe; the second type of semiconductor material can be high-Ge-content SiGe (e.g., Ge content greater than about 20%); the dopant can be Boron; the donor layer can be $GeO_2$; and the chemical reaction is a Ge condensation reaction, wherein $GeO_2$ reacts with SiGe in a manner that forms $SiO_2$ and increases the Ge-content of the SiGe. In embodiments of the invention, the Ge condensation process can be well-controlled, as the reaction of $GeO_2$ with the Ge in the SiGe material only occurs during the anneal, which can, in some embodiments be a spike anneal at a temperature of about 500 C. At these temperatures, there is no reaction of $GeO_2$ with pure silicon. Accordingly, the annealing method of the present invention is highly selective to SiGe. During the Ge condensation process, the reaction scheme selectively condenses Ge by oxidizing Si atom to form $SiO_2$ layer from the surface of the SiGe material on which the $GeO_2$ is deposited. As the reaction proceeds, more Si is converted into $SiO_2$ and removed, and the surface of the SiGe on which the $GeO_2$ was deposited is continuously enriched with more germanium.

The selective condensation of Ge in this manner is self-limited and will continue until either all of the $GeO_2$ is consumed or the SiGe surface becomes sufficiently enriched with germanium that the reaction cannot proceed. In the Ge-limited scenario (e.g., a relatively thick $GeO_2$ layer is deposited), the reaction will stop when the available Si atoms in the SiGe layer for the chemical reaction is not enough. Consequently, the severity of the Ge condensation process can be tuned by adjusting the thickness of the $GeO_2$ layer that has been deposited on the SiGe layer, or by adjusting the anneal temperature.

Accordingly, embodiments of the invention can be used to form an abrupt junction profile in GAA nanosheet FETs by selectively applying a Ge condensation to a low-Ge-content SiGe nanosheet channel to convert selected portions of the low-Ge-content SiGe nanosheet channel to a higher Ge content SiGe nanosheet channel. The Ge condensation process is selective in that it only modifies a central region of the low-Ge-content SiGe nanosheet channel that contacts a deposited layer of $GeO_2$. In accordance with aspects of the invention, a gate dielectric layer, gate spacers, and inner spacers confine the portion of the $GeO_2$ layer that contacts the low-Ge-content SiGe channel nanosheet to the portion of the low-Ge-content SiGe channel nanosheet that will be under the gate. A chemical reaction of $GeO_2$ with the low-Ge-content SiGe channel nanosheet is initiated by a low-temperature anneal process in inert gas ambient (with no oxygen). After the low-temperature Ge condensation anneal converts a selected portion (i.e., an under-the-gate portion) of the low-Ge-content SiGe nanosheet channel to a higher Ge content SiGe nanosheet channel, a dopant drive-in anneal is applied to form S/D extension regions in the portions of the low-Ge-content SiGe nanosheet channel that did not contact and react with $GeO_2$. Because the S/D extension region is still low-Ge-content SiGe, dopants move quickly through the S/D extension region then slow down in the high-Ge-content SiGe nanosheet channel, thereby forming an abrupt p/n junction profile at the interface between the high-Ge-content SiGe nanosheet channel and the low-Ge-content SiGe S/D extension regions.

Turning now to a more detailed description of fabrication operations and resulting structures according to aspects of the invention, FIGS. 1-8A, 9, 10A, and 11 depict a nanosheet-based structure 100 after various fabrication operations for forming nanosheet FETs having abrupt junctions (shown in FIG. 10B) formed between the channel nanosheets and the S/D extension regions. Although the diagrams depicted in FIGS. 1-8A, 9, 10A, and 11 are two-dimensional, it is understood that the structures depicted in FIGS. 1-8A, 9, 10A, and 11 are three-dimensional. The x/y/z diagram depicted in the figures is to represent that the various elements depicted in FIGS. 1-8A, 9, 10A, and 11 extend along a first axis (e.g., x-axis) to define width (or lateral) dimensions, extend along a second axis (e.g., y-axis) perpendicular to the x-axis to define height (or vertical) dimensions, and extend along a third axis (e.g., z-axis) perpendicular to the first axis and the second axis to define depth dimensions. In accordance with standard CMOS fabrication operations, various elements of the fabrication stages depicted in FIGS. 1-8A, 9, 10A, and 11 extend completely around other elements in the x-axis, y-axis, and z-axis directions. For example, the gate structures (e.g., gate dielectric 206, dummy gate 202, and gate spacers 204) shown in FIG. 2 extend over and around the stack 130. The specifics of known three-dimensional structures for GAA nanosheet FET architectures are known to those skilled in the relevant arts.

FIG. 1 depicts a cross-sectional view of the nanosheet-based structure 100 after initial fabrication operations in accordance with aspects of the present invention. As shown in FIG. 1, a nanosheet stack 130 is formed over a substrate 102. In the illustrated embodiments of the invention, the substrate 102 includes a bulk silicon material. Alternatively, the substrate 102 can be implemented in a semiconductor-on-insulator (SOI) configuration. Other suitable semiconductor materials can be used as the substrate 102, including but not limited to monocrystalline Si, SiGe, III-V compound semiconductors, II-VI compound semiconductors, and the like. In some embodiments of the invention where the substrate 102 is an SOI configuration, the substrate 102 includes a buried oxide layer (not depicted). The buried oxide layer can be made of any suitable dielectric material, such as, for example, a silicon oxide.

The nanosheet stack 130 includes an alternating series of SiGe channel nanosheet layers 112, 114, 116 and SiGe sacrificial nanosheet layers 122, 124, 126. In accordance with aspects of the invention, the nanosheet stack 130 is epitaxially grown from the substrate 102. The alternating layers 122, 112, 124, 114, 126, 116 of the nanosheet stack 130 are formed by epitaxially growing one layer and then the next until the desired number and desired thicknesses of the nanosheet layers are achieved. Although six alternating layers 122, 112, 124, 114, 126, 116 are depicted in the figures, any number of alternating layers can be provided. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In embodiments of the invention, the sacrificial nanosheets 122, 124, 126 can be SiGe 35%. The notation "SiGe 35%" is used to indicate that 35% of the SiGe material is Ge and 65% of the SiGe material is Si. In some embodiments of the invention, the Ge percentage in the SiGe sacrificial nanosheets 122, 124, 126 can have a Ge-content that is sufficiently different from the Ge-content of the SiGe channel nanosheets 112, 114, 116 to provide etch selectivity between the SiGe sacrificial nanosheets 122, 124, 126 and the SiGe channel nanosheets 112, 114, 116. In embodiments of the invention, the channel nanosheets 112, 114, 116 can be SiGe 10%. In some embodiments of the invention, the Ge-content of the channel nanosheets 112, 114, 116 is a low-Ge-content that is about 20% or less. In some embodiments of the invention, the Ge-content of the channel nanosheets 112, 114, 116 can be substantially zero such that the channel nanosheets 112, 114, 116 are Si.

Figure 2:
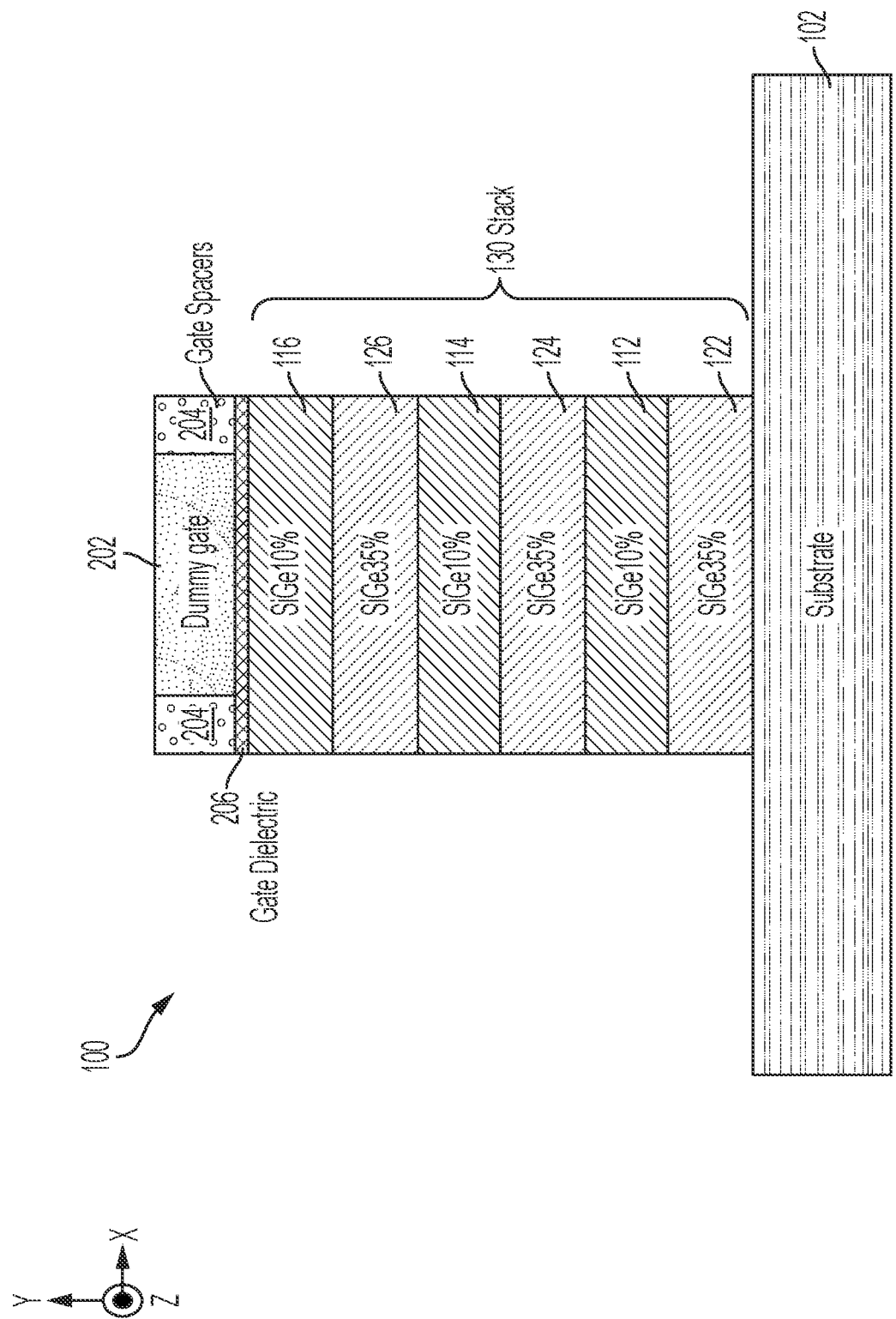

In FIG. 2, known fabrication operations have been used to form a gate dielectric 206, a dummy gate 202, and gate spacers 204 over a selected portion of the nanosheet stack 130. The portion of the nanosheet stack 130 that is still exposed is etched to form the nanosheet structure 100 shown in FIG. 2. In aspects of the invention, the gate dielectric 206 can be formed by depositing a dielectric layer (e.g., an oxide) (not shown) everywhere on the structure 100. The dielectric layer, which will be etched in subsequent fabrication operations to form the gate dielectric 206, can be deposited conformally using any suitable conformal deposition process (e.g., atomic layer depositions (ALD)), and can include interfacial layers (IL) and high-k dielectric layers. A layer of amorphous silicon (a-Si) (not shown) is deposited over the dielectric layer. The a-Si layer is planarized then patterned (e.g., using a hard mask (not shown)) and etched using, for example, a dry etch, or a combination of sequential dry and wet etches to form the dummy gate 202. The gate spacers 204 are formed on sidewalls of the dummy gate 202 using, for example, CVD, PECVD, ALD, PVD, chemical solution deposition, or other like processes in combination with a wet or dry etch process. In embodiments of the invention, the gate spacers 204 can be SiN, SiBCN, or other similar materials.

Referring still to FIG. 2, the gate spacers 204 and the dummy gate 202 have been used as a mask, and the portions of the dielectric layer that are not under the gate spacers 204 and dummy gate 202 are removed using any suitable removal process to form the gate dielectric 206. Wet or dry etch processes are applied in order to etch portions of the nanosheet stack 130 that are not covered by the gate dielectric 206, the gate spacers 204, and the dummy gate 202, thereby reducing the footprint of the nanosheet stack 130 and converting the nanosheet stack 130 into an elongated fin-shaped column having its long dimension extending along the z-axis.

Figure 3:
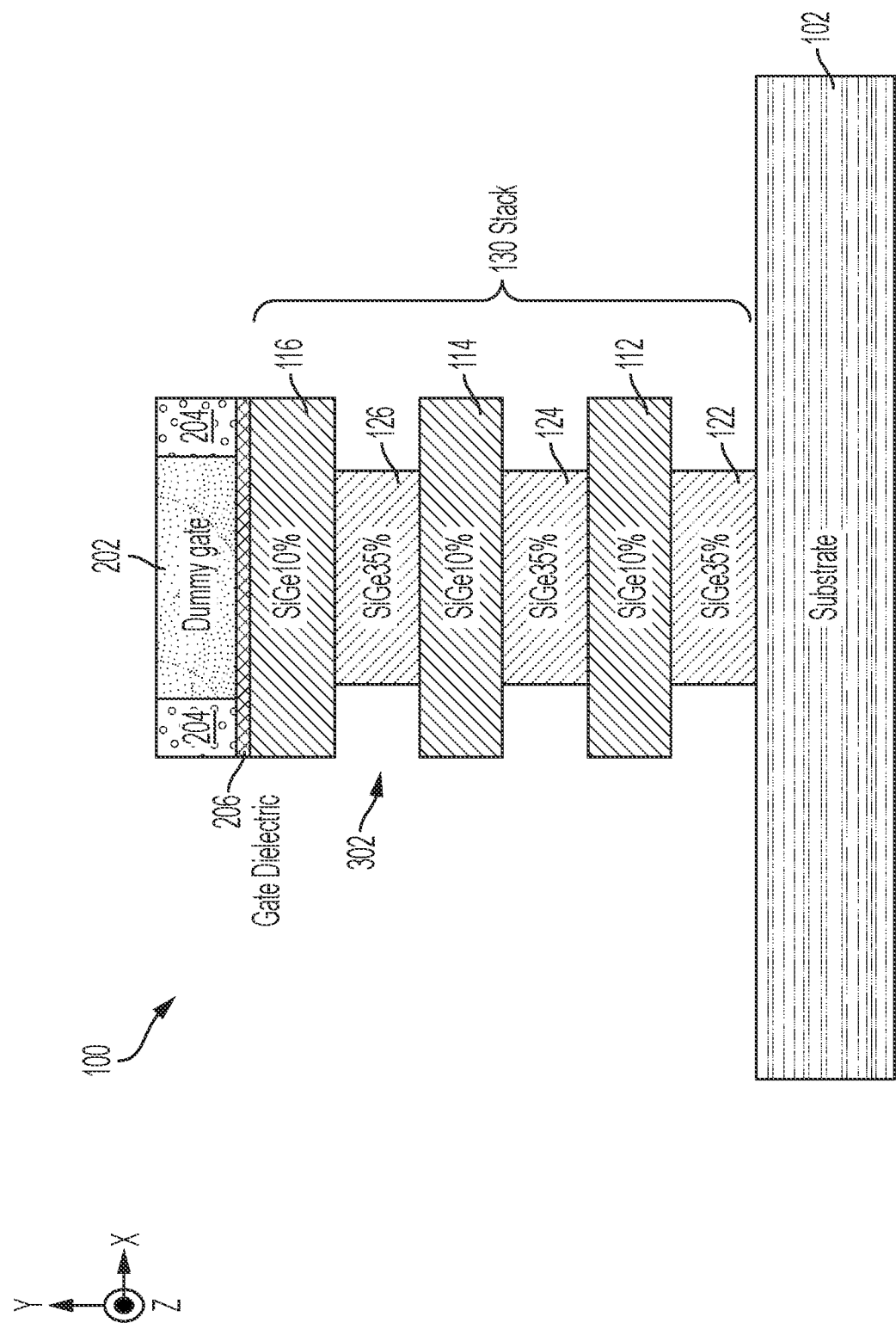

In FIG. 3, known semiconductor fabrication processes have been used to partially remove end regions of the SiGe35% sacrificial nanosheet regions 122, 124, 126 to form cavities 302. In embodiments of the invention, the end regions of the SiGe35% sacrificial nanosheets 122, 124, 126 can be removed using a first application of a so-called "pull-back" process to pull the SiGe35% sacrificial nanosheet regions 122, 124, 126 back an initial pull-back distance such that the ends of the sacrificial nanosheets 122, 124, 126 now terminate at an inner edge of the gate spacers 204. In embodiments of the invention, the pull-back process leverages the fact that the sacrificial nanosheets 122, 124, 126 are formed from SiGe35%, which can be selectively etched with respect to the SiGe10% channel nanosheets 112, 114, 116 using, for example, a standard cleaning 1 (SC-1) or a vapor phase hydrogen chloride (HCl) gas isotropic etch process.

Figure 4:
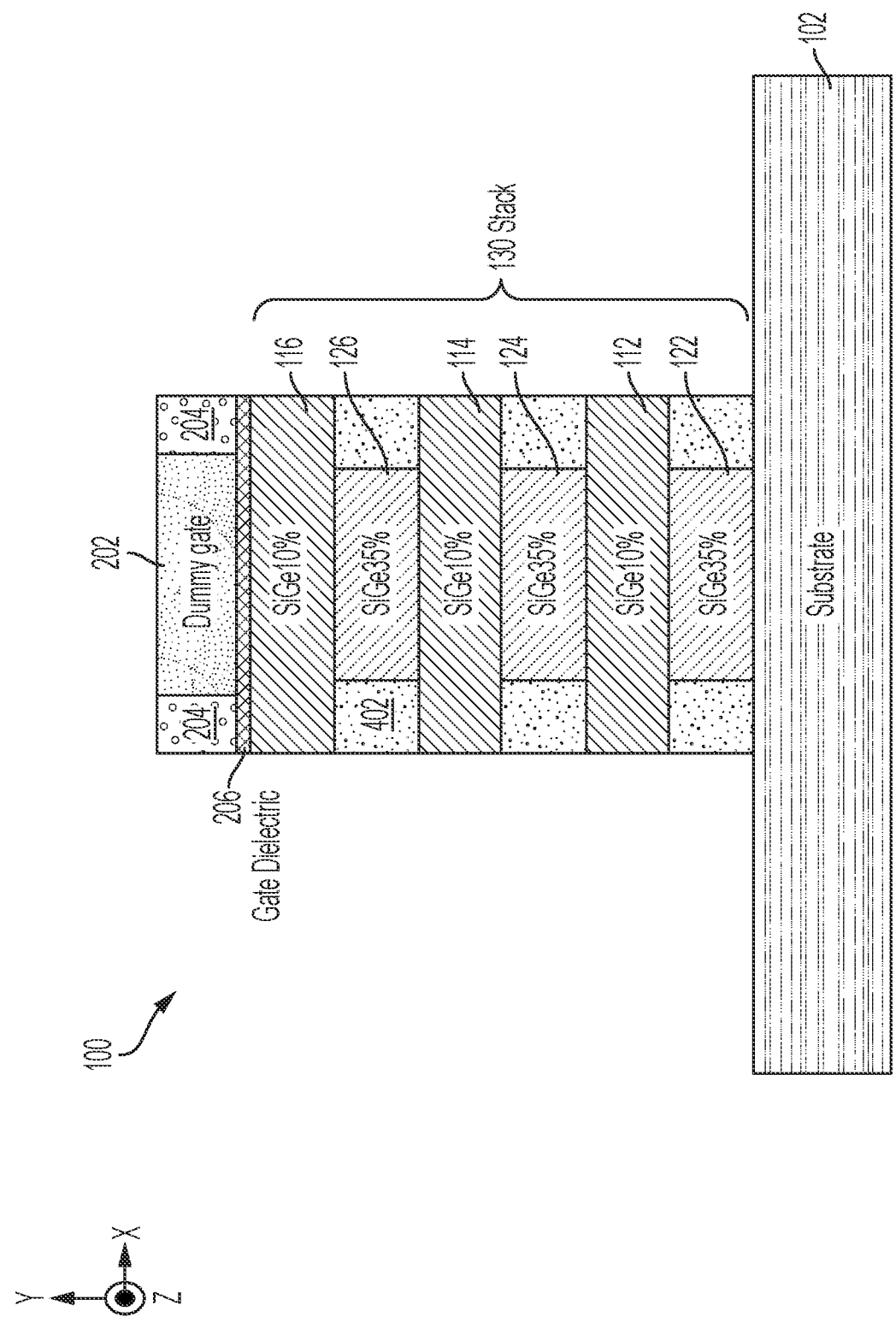

In FIG. 4, known semiconductor device fabrication processes have been used to form inner spacers 402 in the cavities 302 (shown in FIG. 3). In embodiments of the invention, the inner spacers 402 can be formed using, e.g., a conformal deposition process to deposit inner spacer material (now shown) over the nanosheet structure 100. The conformally deposited inner spacer material pinches off in the cavities 302 to form the inner spacers 402. A subsequent isotropic or anisotropic etch back is performed to remove excess inner spacer material on exposed vertical and horizontal surfaces of the structure 100. The inner spacers 402 can be silicon nitride, siliconboron carbonitride, silicon carbonitride, silicon carbon oxynitride, or any other type of dielectric material (e.g., a dielectric material having a dielectric constant k of less than about 5).

Figure 5:
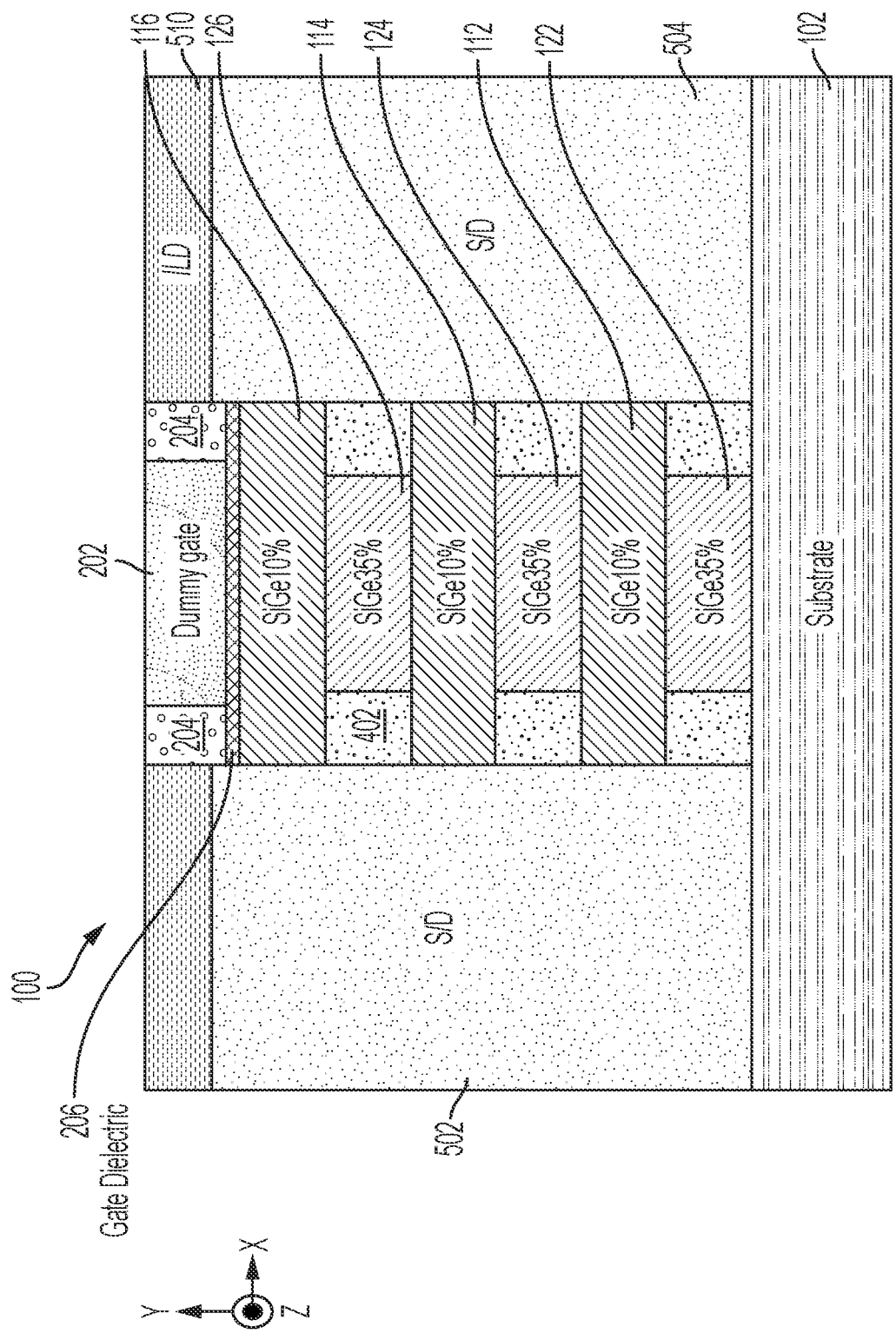

In FIG. 5, known fabrication operations have been used to form a doped $Si_{1-x}Ge_x$ S/D region 502 and a doped $Si_{1-x}Ge_x$ S/D region 504 on the end regions of the channel nanosheets 112, 114, 116, thereby creating initial p/n junctions at the interfaces between the channel nanosheets 112, 114, 116 and the raised S/D regions 502, 504. Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p–n junction, which consists of a contact between a p-type piece of silicon, rich in holes, and an n-type piece of silicon, rich in electrons. N-type and p-type FETs are formed by implanting different types of dopants to selected regions of the device to form the necessary junction (s). N-type devices can be formed by implanting arsenic (As) or phosphorous (P), and p-type devices can be formed by implanting boron (B).

The doped S/D regions 502, 504 can be formed by a variety of methods, such as, for example, in-situ doped epitaxy, doping following the epitaxy, implantation and plasma doping, ultrahigh vacuum chemical vapor deposition (UHVCVD), rapid thermal chemical vapor deposition (RT-CVD), metal organic chemical vapor deposition (MOCVD), low-pressure chemical vapor deposition (LPCVD), limited reaction processing CVD (LRPCVD), and MBE. In some embodiments of the invention, the $Si_{1-x}Ge_x$ doped S/D regions 502, 504 can be doped during deposition (in-situ doped) by adding dopants such as n-type dopants (e.g., phosphorus or arsenic) or p-type dopants (e.g., Ga, B, $BF_2$, or Al). Because the final nanosheet FET 100 (shown in FIG. 11) is a p-type FET, the $Si_{1-x}Ge_x$ S/D region 502 and the $Si_{1-x}Ge_x$ S/D region 504 are doped with p-type B. The dopant concentration in the $Si_{1-x}Ge_x$ S/D region 502 and the $Si_{1-x}Ge_x$ S/D region 504 can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$. To reduce S/D contact resistance, the $Si_{1-x}Ge_x$ S/D regions 502, 504 are highly doped and have a higher Ge % (e.g., Ge %≥ about 50%). In embodiments of the invention, the Ge % in the $Si_{1-x}Ge_x$ S/D regions 502, 504 can be selected to maximize the dopant solubility in the $Si_{1-x}Ge_x$ S/D regions 502, 504. For example, it is generally accepted that a Ge % that can maximize the B solubility in the $Si_{1-x}Ge_x$ source and drain regions 502, 504 is a Ge %≥ about 65%.

Figure 6:
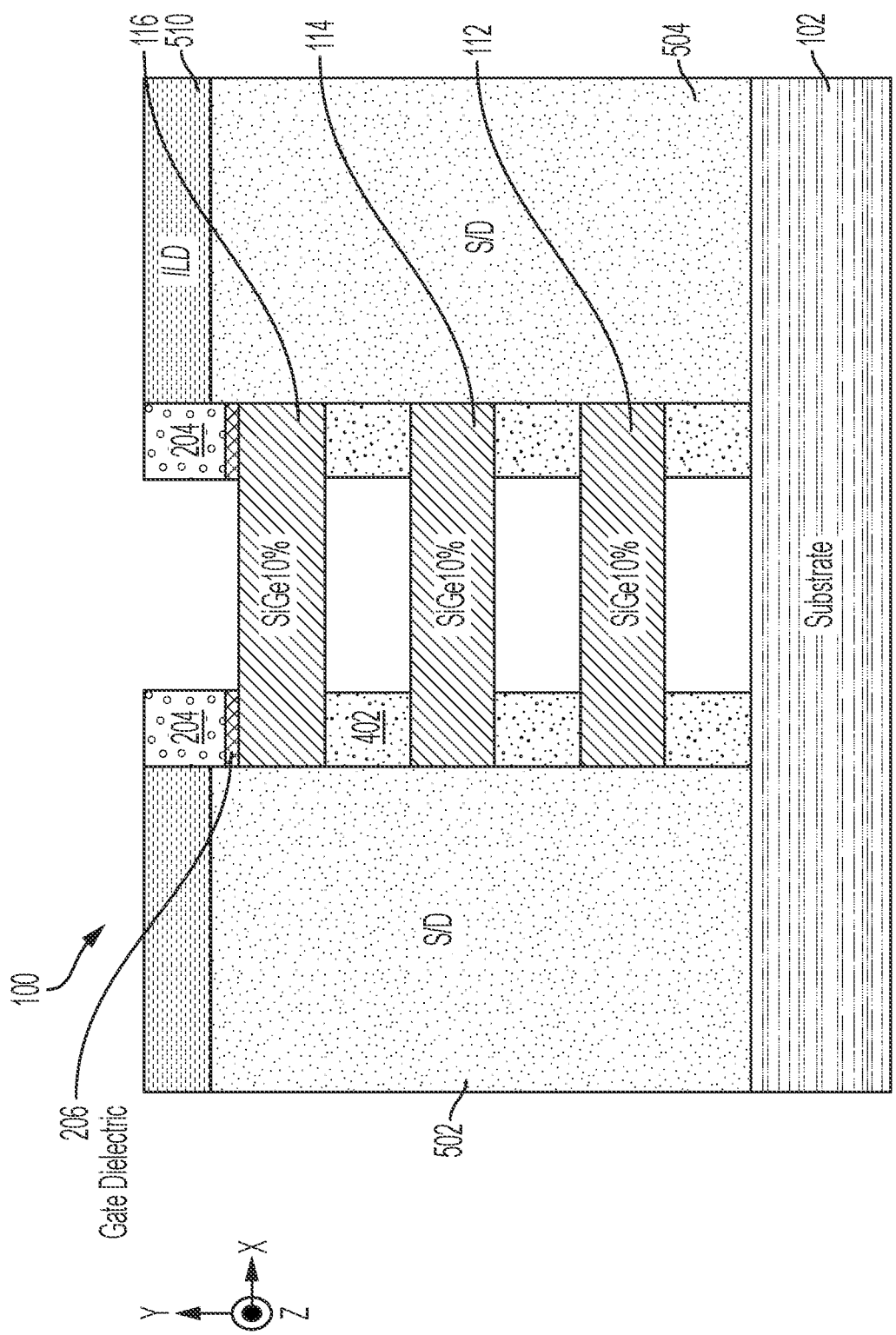

In FIG. 6, the dummy gate 202 and a portion of the gate dielectric 206 that was under the dummy gate 202 have been removed. The dummy gate 202 and the gate dielectric 206 can be removed by a known etching process, e.g., RIE or chemical oxide removal (COR). Known semiconductor fabrication operations have also been used to remove the SiGe 35% sacrificial nanosheets 122, 124, 126. In embodiments of the invention, the sacrificial nanosheets 122, 124, 126 are formed from SiGe35%, which can be selectively etched with respect to the SiGe10% channel nanosheets 112, 114, 116 using, for example, a vapor phase hydrogen chloride (HCL) gas isotropic etch process or hot SC-1 wet chemistry.

Figure 7:
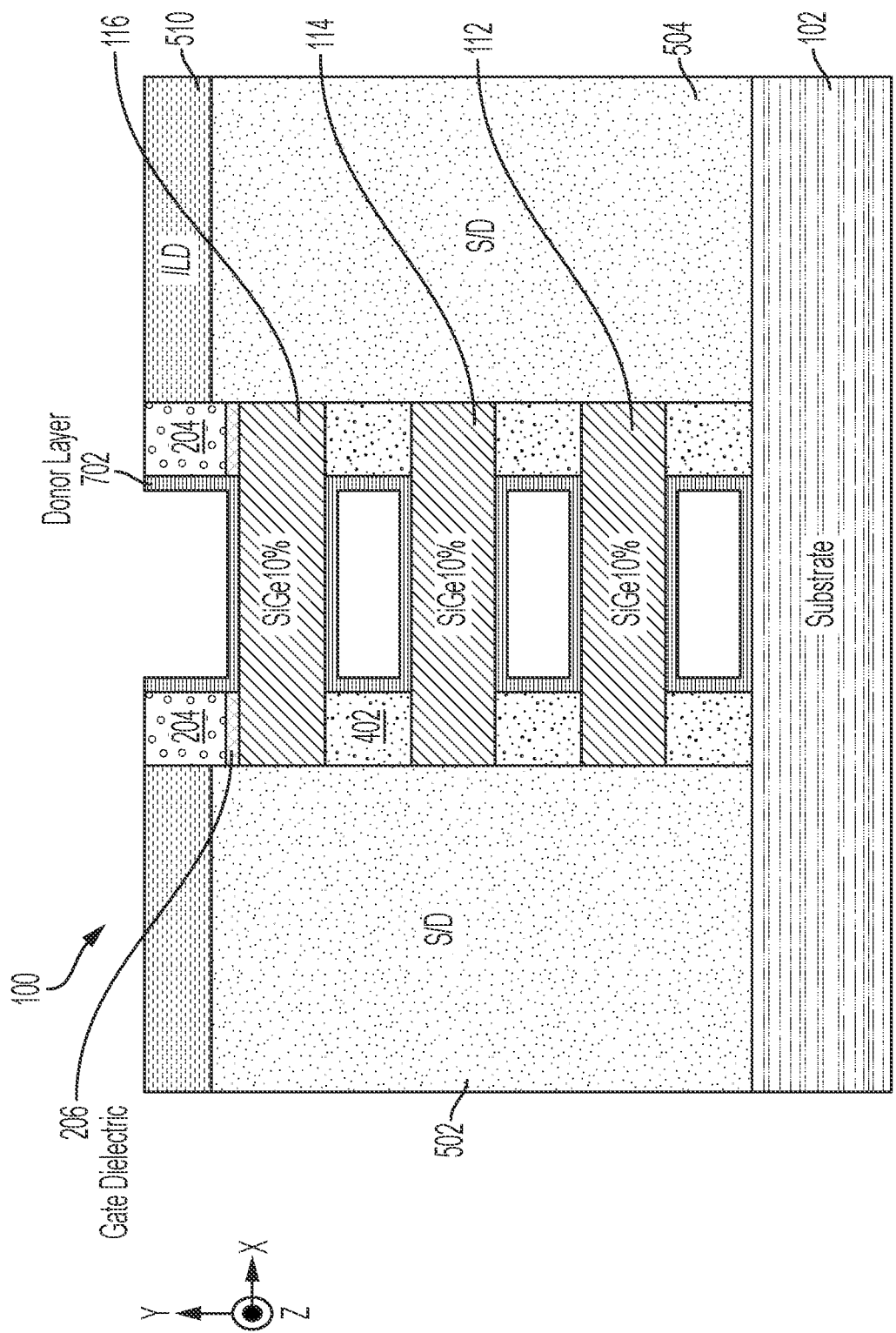
Figure 8A:
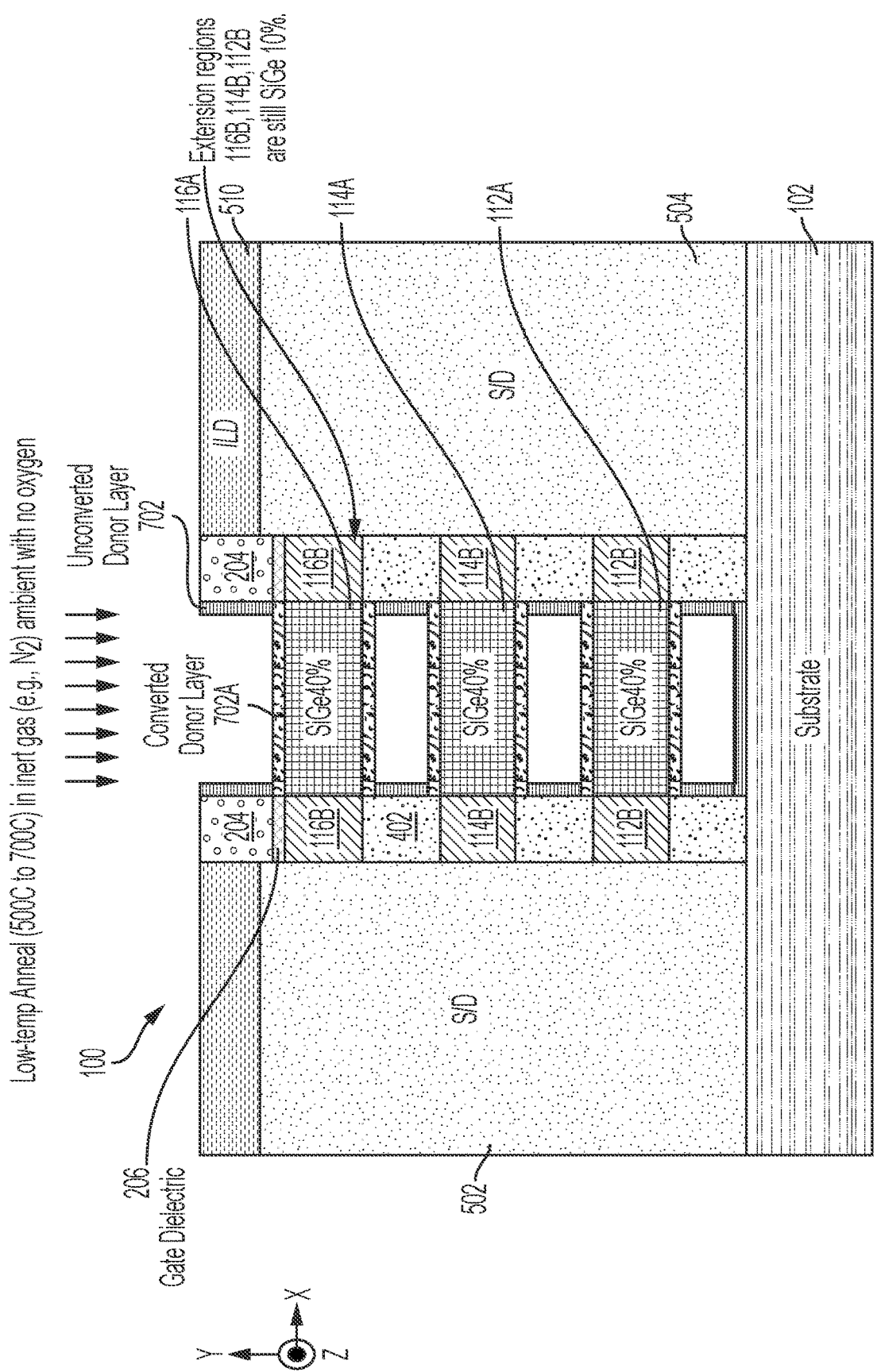
FIG. 8A depicts a cross-sectional view of a nanosheet-based structure after additional fabrication operations in accordance with aspects of the present invention.
Figure 8B:
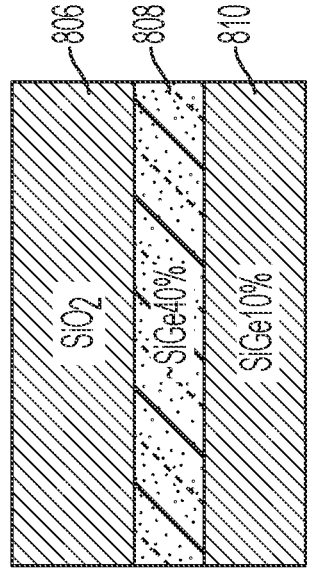
FIG. 8B depicts a diagram illustrating the selective Ge condensation in SiGe from an anneal-driven reaction between germanium dioxide and silicon germanium applied in FIG. 8A according to embodiments of the invention.
Figure 8B:
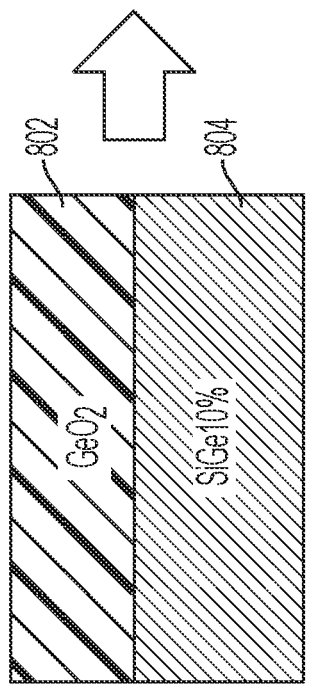

FIG. 8B depicts an example of a Ge condensation process that is applied in FIGS. 7 and 8A. More specifically, FIG. 8B depicts a diagram illustrating the selective Ge condensation in a SiGe layer from an anneal-driven reaction between germanium dioxide and silicon germanium in accordance with embodiments of the invention. As shown in FIG. 8B, the pre-anneal structure is a $GeO_2$ layer 802 over a SiGe 10% layer 804, and the post-anneal structure is a $SiO_2$ layer 806 formed over a SiGe 40% layer 808 and a SiGe 10% layer 810. The anneal reaction proceeds according to Equation 1 shown in FIG. 8B. The $GeO_2$ layer 802 will react with the SiGe 10% layer 804, thus leading to a condensation of germanium and converting the $GeO_2$ layer 802 to $SiO_2$, thereby forming the $SiO_2$ layer 806. During the novel process for forming the central regions 112A, 114A, 116A, the reaction scheme selectively condenses Ge by oxidizing Si atom to form a $SiO_2$ layer from the surface of the SiGe material on which the $GeO_2$ is deposited, thus removing Si from the surface of the SiGe 10% layer 804. As the reaction proceeds, more Si is converted into $SiO_2$ and removed, and the surface of the SiGe layer 804 is continuously enriched with more germanium to form the SiGe 40% 808. As the reaction proceeds the ratio of the SiGe layer 808 to the SiGe layer 810 continues to increase until a desired ratio is reached.

FIGS. 7 and 8A depict the results of fabrication operations that use the Ge condensation process depicted in FIG. 8B to convert the low-Ge-content SiGe channel nanosheets 112, 114, 116 to multi-segmented channel nanosheets having low-Ge-content SiGe end regions 112B, 114B, 116B and high-Ge-content SiGe central regions 112A, 114A, 116A in accordance with aspects of the invention. In FIG. 7, known semiconductor fabrication techniques have been used to conformally deposit (e.g., using ALD) a $GeO_2$ donor layer 702 over the nanosheet-based structure 100. In some aspects of the invention, the structure 100 can be planarized to remove the donor layer 702 from top surfaces of the ILD 510 and the gate spacers 204. In some aspects of the invention, the donor layer 702 is not removed from top surfaces of the ILD 510 and the gate spacers 204 because the donor layer 702 will not have any reaction with the ILD 510 and the gate spacers 204.

In FIG. 8A, according to embodiments of the invention, a spike anneal is applied to the nanosheet-based structure 100 at about 500 Celsius in an $N_2$ ambient with no oxygen. In aspects of the invention, the spike anneal temperature can range from about 500 C to about 700 C. Following the reaction described previously herein and illustrated in FIG. 8A, $GeO_2$ in the portions of the donor layer 702 that contact SiGe in the channel nanosheets 112, 114, 116 (shown in FIG. 7) convert to a $SiO_2$ converted donor layer 702A through Ge condensation, thereby forming SiGe 40% central regions 112A, 114B, 116C.

Figure 9:
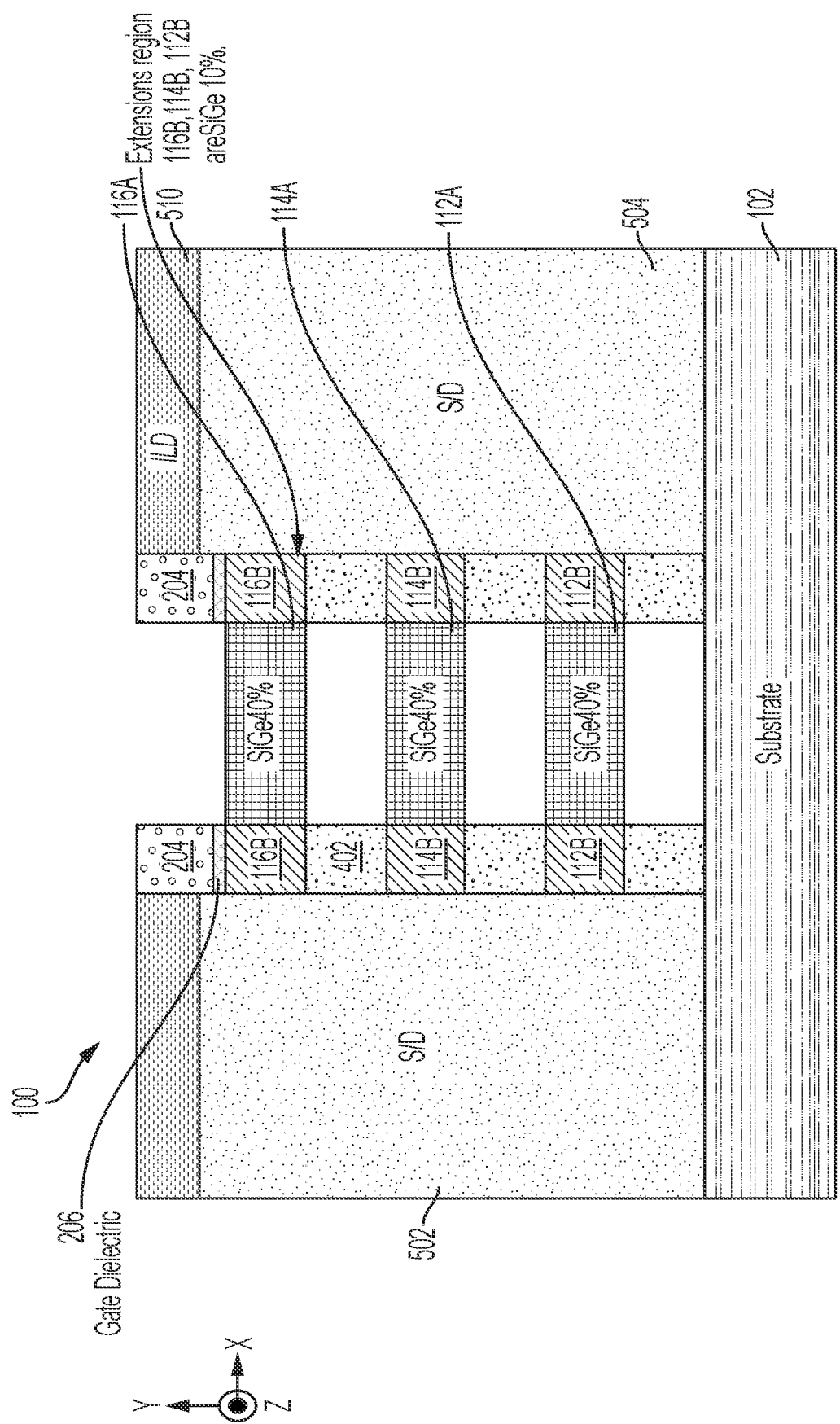

In FIG. 9, known FET fabrication techniques have been used to remove the unreacted $GeO_2$ donor layers 702 and the reacted $SiO_2$ donor layers 702A using diluted HF.

Figure 10A:
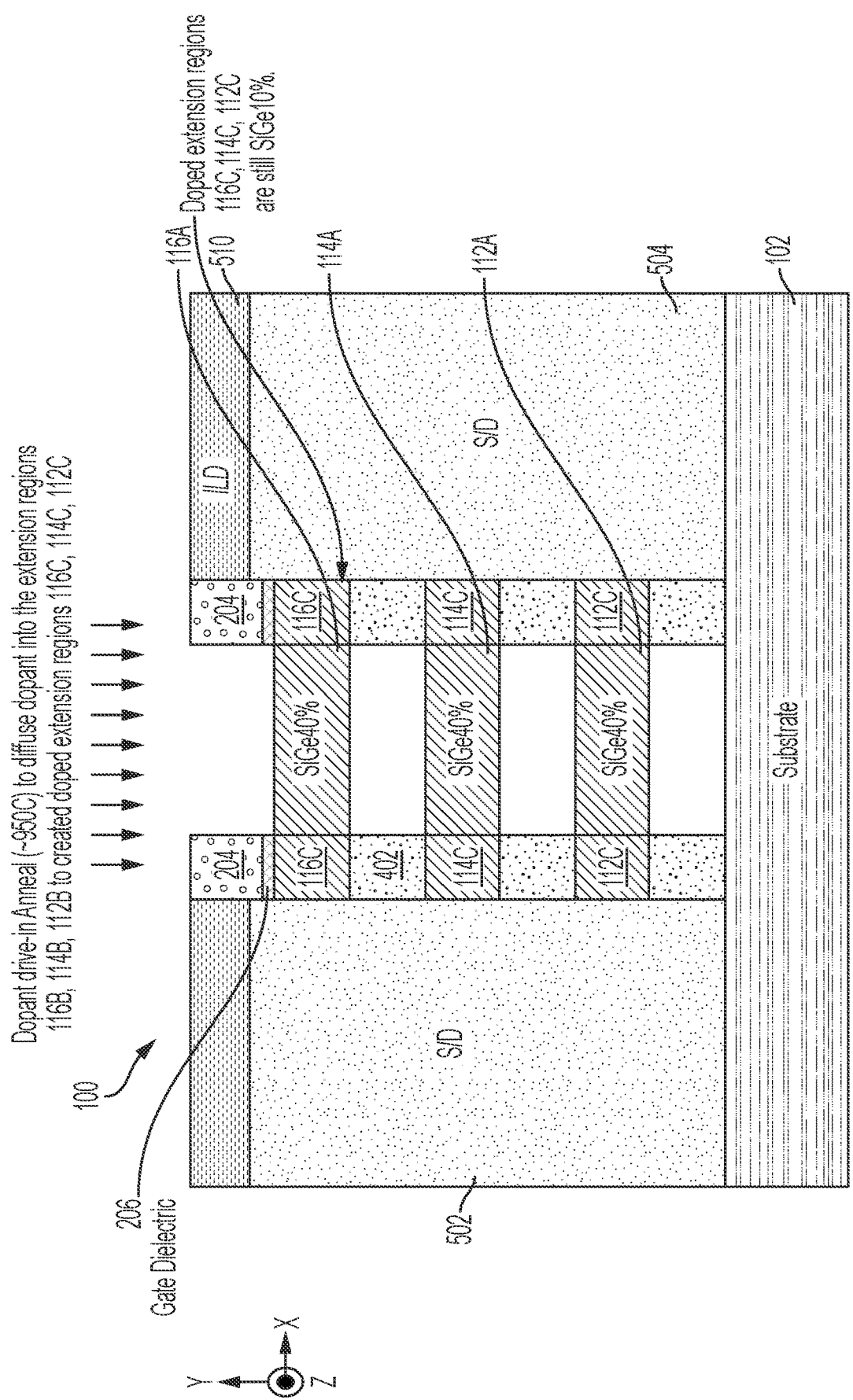
FIG. 10A depicts a cross-sectional view of a nanosheet-based structure after additional fabrication operations in accordance with aspects of the present invention.
Figure 10B:
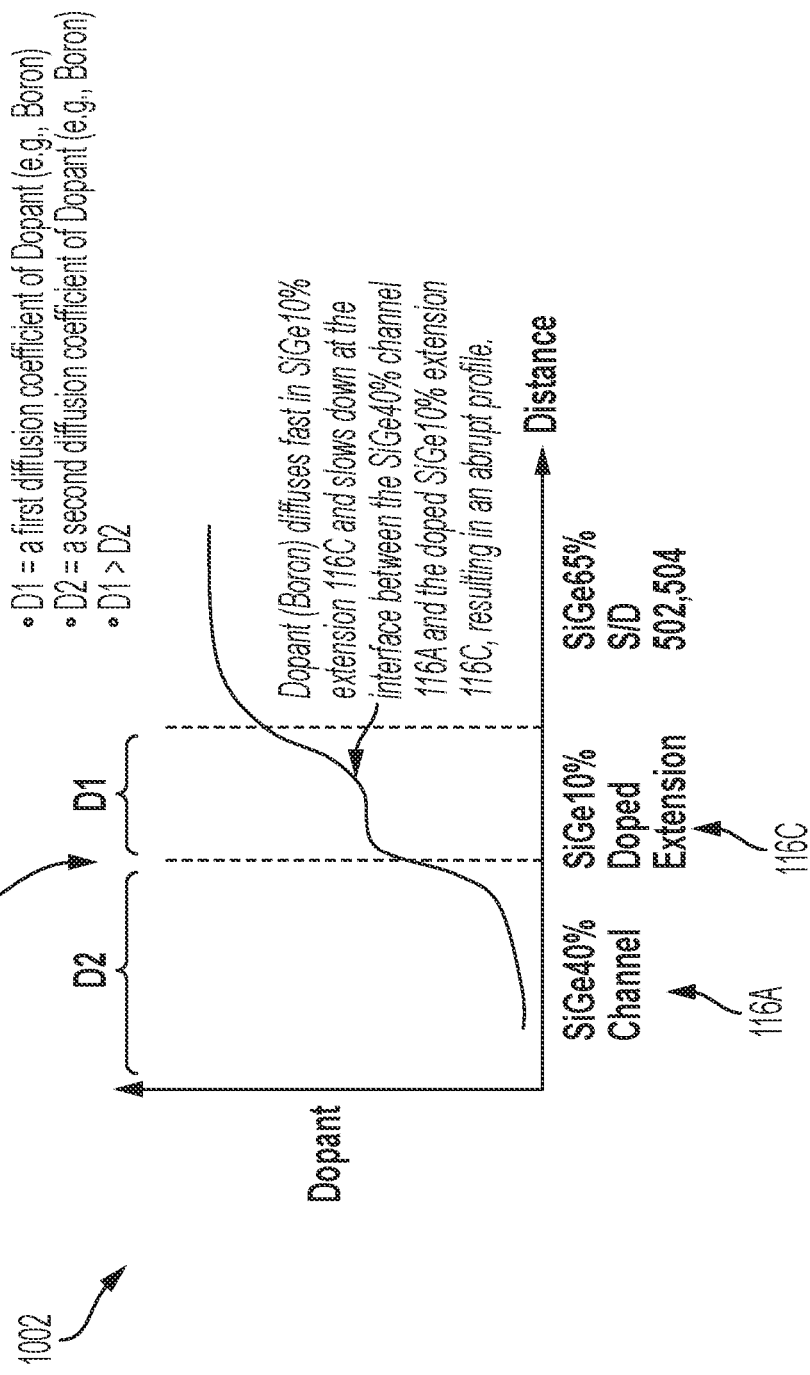
FIG. 10B depicts a diagram illustrating additional details about how the dopant drive-in process applied in FIG. 10A is used to form abrupt junctions at the channel/extension interface of the nanosheet structure in accordance with aspects of the invention.

In FIGS. 10A, 10B, a dopant drive-in anneal (e.g., a rapid thermal anneal (RTA)) has been performed to activate and drive in the implanted B dopants. In accordance with aspects of the invention, the dopant drive-in anneal is controlled to, in effect convert the channel nanosheet end regions 112B, 114B, 116B (shown in FIG. 8A) to so-called "extension" regions 112C, 114C, 116C (shown in FIG. 10A) that act as extensions of the S/D regions 502, 504, thereby shifting the channel/SD junction to the interface between the high-Gecontent central regions 112A, 114A, 116A and the low-Ge-content extension regions 112C, 114C, 116C. In accordance with aspects of the invention, the positions of the interfaces between the high-Ge-content central regions 112A, 114A, 116A and the low-Ge-content extension regions 112C, 114C, 116C are precisely located using the low temperature Ge condensation process depicted in FIGS. 8A, 8B.

FIG. 10B depicts a graph 1002 that further illustrates the dopant drive-in process applied in FIG. 10A. The graph 1002 plots post-drive-in anneal dopant concentration vs. lateral distance of the high-Ge-content SiGe central channel region 116A, the low-Ge-content doped SiGe extension region 116C, and the doped high-Ge-content SiGe S/D regions 502, 504. In embodiments of the invention, when the low-Ge-content SiGe extension region 116B (shown in FIG. 8A) is at the drive-in anneal temperature, the low-Ge-content SiGe channel 116B has a first diffusion coefficient (D1) for boron. In embodiments of the invention, when the high-Ge-content SiGe channel 116A is at the drive-in anneal temperature, the high-Ge-content SiGe channel 116A has a second diffusion coefficient (D2) for boron. In aspects of the invention, D1 is greater than D2. In other words, the boron dopant diffuses at the dopant drive-in anneal temperature faster through low-Ge-content end region 116B than the high-Ge-content SiGe channel 116A. The dopant drive-in anneal causes the boron dopant to diffuse from the doped S/D region 502, 504 into the low-Ge-content end region 116B, thereby converting the low-Ge-content end region 116B to the doped low-Ge-content SiGe extension region 116C. The doped low-Ge-content SiGe extension region 116C forms a p/n junction with the high-Ge-content SiGe channel 116A. In accordance with aspects of the invention, because D1 is greater than D2, the boron dopant moves quickly through the low-Ge-content SiGe end region 116B, and moves more slowly through the high-Ge-content SiGe channel 116A, thereby forming an abrupt p/n junction between the doped low-Ge-content SiGe extension region 116C and the high-Ge-content SiGe channel 116A. In general, an abrupt p/n junction is a sharp interface between a p-type semiconductor material and an n-type semiconductor material. In other words, an interface between the two semiconductors is an abrupt interface if the p/n properties of the two semiconductors change sharply across the junction.

Figure 11:
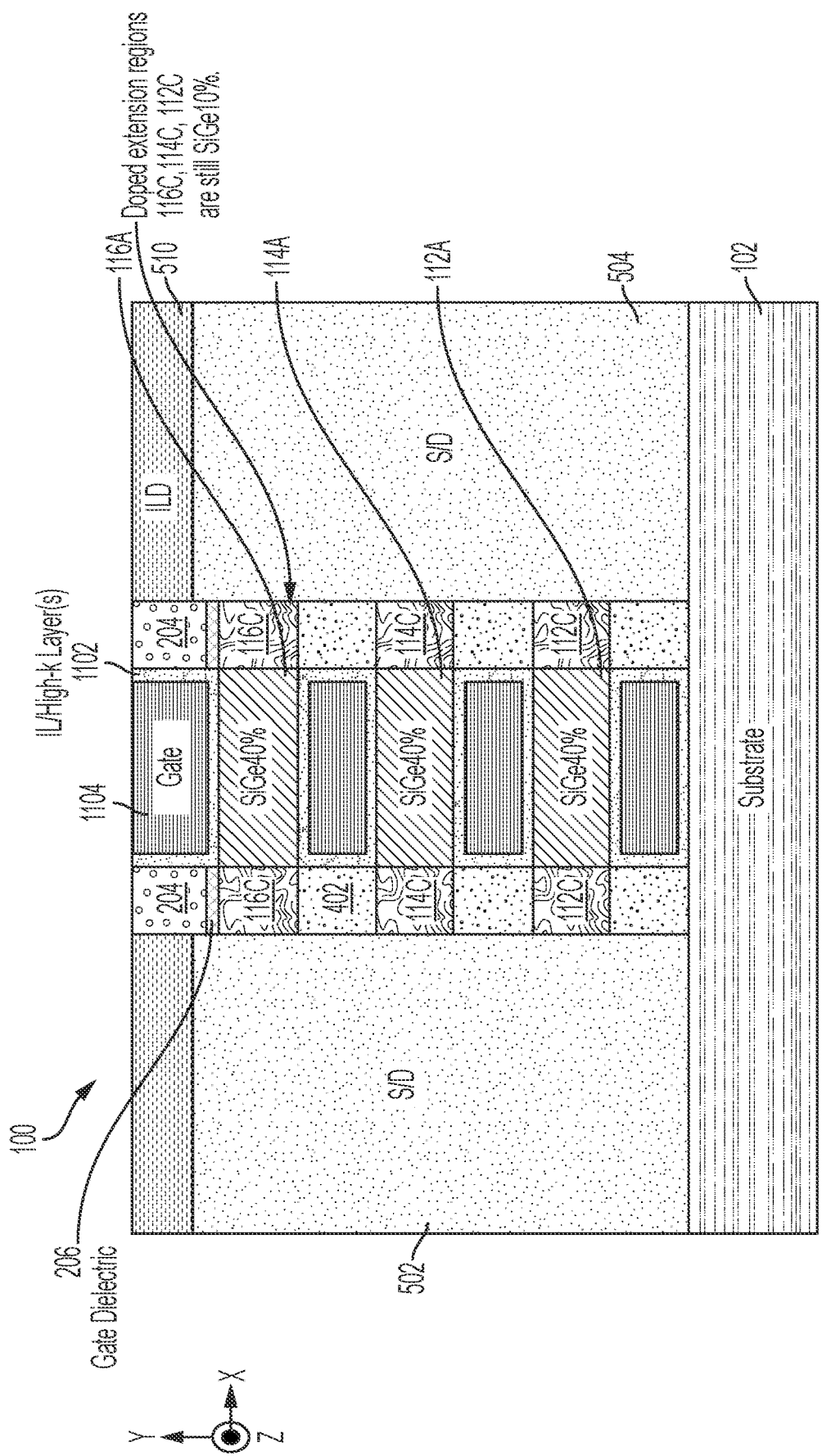

In FIG. 11, known fabrication operations have been used to replace the removed sacrificial nanosheet layers 122, 124, 126 and the removed dummy gate 202 with a dielectric layer 1102 and a metal gate structure 1104. The dielectric layer 1102 can include interfacial layers (IL) and high-k dielectric layers. In some embodiments of the invention, the high-k dielectric layers can modify the work function of the WFM 1104. The high-k dielectric layer can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum.

In embodiments of the invention, the metal gate structure 1104 can include metal liners (not shown) and work-function metals (WFMs) (not shown). In embodiments of the invention, the WFM can be, for example, TiN or TaN, and the metal gate 1104 can be aluminum or tungsten. In the nanosheet-based structure 100 shown in FIG. 11, the dielectric layers 1102 and the metal gate structures 1104 surround the stacked nanosheet channels 112A, 114A, 116A and regulate electron flow through the nanosheet channels 112A, 114A, 116A between the raised S/D region 502 and the raised S/D region 504.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The diffusion coefficient (D) expresses the amount of particles that diffuse across a unit area in one time unit, when the gradient is 1 unit.

What is claimed is:

1. A nanosheet field effect transistor (FET) device comprising:
   a nanosheet stack formed over a substrate;
   wherein the nanosheet stack comprises a plurality of channel nanosheets;
   wherein the plurality of channel nanosheets includes a first channel nanosheet having a first end region, a second end region, and a central region positioned between the first end region and the second end region;
   wherein the first end region and the second end region comprise a first type of semiconductor material;
   wherein, when the first type of semiconductor material is at a first temperature, the first type of semiconductor material has a first diffusion coefficient for a dopant;
   wherein the central region comprises a second type of semiconductor material; and
   wherein, when the second type of semiconductor material is at the first temperature, the second type of semiconductor material has a second diffusion coefficient for the dopant.

2. The device of claim 1 further comprising a source or drain (S/D) region formed over the substrate.

3. The device of claim 2,
   wherein the S/D region is communicatively coupled to the first end region.

4. The device of claim 3, wherein the S/D region is doped with the dopant.

5. The device of claim 4 further comprising a junction between the first end region and the central region.

6. The device of claim 5, wherein the first end region comprises dopants received from the S/D region.

7. The device of claim 6, wherein the first type of semiconductor material comprises a first SiGe alloy having a first Ge concentration.

8. The device of claim 7, wherein the first type of semiconductor material comprises a first SiGe alloy having a first Ge concentration.

9. The device of claim 8, wherein the second type of semiconductor material comprises a second SiGe alloy having a second Ge concentration.

10. The device of claim 9, wherein:
    the first Ge concentration is less than the second Ge concentration; and
    the first diffusion coefficient is greater than the second diffusion coefficient.

11. A nanosheet field effect transistor (FET) device comprising:
    a nanosheet stack formed over a substrate;
    wherein the nanosheet stack comprises a plurality of channel nanosheets;
    wherein the plurality of channel nanosheets includes a first channel nanosheet having a first end region, a second end region, and a central region positioned between the first end region and the second end region;
    wherein the first end region and the second end region comprise a first type of semiconductor material;
    wherein, when the first type of semiconductor material is at a first temperature, the first type of semiconductor material has a first diffusion coefficient for a dopant;
    wherein the central region comprises a second type of semiconductor material;
    wherein, when the second type of semiconductor material is at the first temperature, the second type of semiconductor material has a second diffusion coefficient for the dopant;
    an source or drain (S/D) region formed over the substrate and epitaxially grown from the first end region such that the S/D region is communicatively coupled to the first end region;
    wherein the S/D region is doped with the dopant; and
    a junction formed between the first end region and the central region;
    wherein the first diffusion coefficient is greater than the second diffusion coefficient.

12. The device of claim 11, wherein the first type of semiconductor material includes a first concentration of a first semiconductor.

13. The device of claim 12, wherein the second type of semiconductor material includes a second concentration of the first semiconductor.

14. The device of claim 13, wherein the first concentration is less than the second concentration.

15. The device of claim 14, wherein the first type of semiconductor material comprises a first SiGe alloy.

16. The device of claim 15, wherein the first semiconductor comprises Ge.

17. The device of claim 15, wherein the second type of semiconductor material comprises a second SiGe alloy.

18. The device of claim 17, wherein the first type of semiconductor material comprises a first SiGe alloy having a first Ge concentration.

19. The device of claim 18, wherein the second type of semiconductor material comprises a second SiGe alloy having a second Ge concentration.

20. The device of claim 19, wherein the first Ge concentration is less than the second Ge concentration.

* * * * *